United States Patent
Wu et al.

[11] Patent Number: 6,093,639
[45] Date of Patent: *Jul. 25, 2000

[54] PROCESS FOR MAKING CONTACT PLUG

[75] Inventors: Clint Wu, Tai Chung; Horng-Bor Lu; Jenn-Tarng Lin, both of Hsinchu, all of Taiwan

[73] Assignee: United Microelectronics Corp., Taiwan

[ * ] Notice: This patent issued on a continued prosecution application filed under 37 CFR 1.53(d), and is subject to the twenty year patent term provisions of 35 U.S.C. 154(a)(2).

[21] Appl. No.: 08/739,853

[22] Filed: Oct. 30, 1996

[51] Int. Cl.⁷ .................. H01L 21/4763; H01L 21/44
[52] U.S. Cl. .................. 438/629; 438/633; 438/637; 438/644; 438/645; 438/654; 438/656; 438/660; 438/663
[58] Field of Search .................. 438/637, 633, 438/629, 628, 643, 645, 654, 656, 660, 663, 685

[56] References Cited

U.S. PATENT DOCUMENTS

| | | | |
|---|---|---|---|
| 5,175,126 | 12/1992 | Ho et al. | 437/190 |
| 5,462,890 | 10/1995 | Hwang et al. | 438/637 |
| 5,591,672 | 1/1997 | Lee et al. | 438/533 |
| 5,612,253 | 3/1997 | Farahani et al. | 438/643 |
| 5,801,095 | 9/1998 | Huang et al. | 438/627 |
| 5,801,098 | 9/1998 | Fiordalice et al. | 438/653 |
| 5,827,777 | 10/1998 | Schinella et al. | 438/629 |
| 5,851,912 | 12/1998 | Liaw et al. | 438/621 |
| 5,874,355 | 2/1999 | Huang et al. | 438/627 |

*Primary Examiner*—John F. Niebling
*Assistant Examiner*—Ha Tran Nguyen
*Attorney, Agent, or Firm*—Rabin & Champagne, P.C.

[57] ABSTRACT

A process for fabricating contact plugs for semiconductor IC devices. An insulating layer is formed over the surface of an IC substrate. The insulating layer is then patterned for forming contact vias revealing the surface of an electrically conductive region of the IC circuitry that requires electrical connections by the contact plugs. A glue (adhesive) layer is then formed over the sidewall surface inside the contact vias. The glue (adhesive) layer is densified by either a rapid thermal annealing or a plasma treatment in order to prevent the formation of voids when the plugs are formed. The internal space of the contact vias are then filled with an electrically conductive material to form the contact plugs. The surface of the device substrate is then polished to remove the electrically conductive material and glue layer covering the surface of the insulating layer until the insulating layer surface is exposed, and top surface of the formed contact plug is planarized flat with the surface of the insulating layer.

20 Claims, 5 Drawing Sheets

PROCESS FOR MAKING CONTACT PLUG

BACKGROUND OF THE INVENTION

1. Field of the Invention

The invention relates in general to a process for fabricating a semiconductor device, and in particular to a process for making a contact plug in a semiconductor integrated circuit device. More particularly, the invention relates to a process for making a contact plug that is free from the formation of voids inside the plug.

2. Technical Background

As the integration density in semiconductor integrated circuit (IC) devices continues to increase, there has been ever smaller, and frequently insufficient, surface area for fabricating interconnects necessary for the electronic circuits thereof. Techniques for multiple-level metallization have therefore been developed for miniaturized IC designs which are now widely used. Multiple-level metallization techniques are particularly desirable for sophisticated IC devices, high-performance microprocessors for example, in order that interconnections between the complex functional parts can be suitably provided.

Between the multiple levels of metallization implementing the interconnections, contact plugs are used for the communication between the different established levels. Under normal circumstances, an electrically conductive contact plug is fabricated by etching into an insulating layer to form a contact via, which is then filled with electrically conductive material that constitutes the plug. Tungsten is the material most widely used for filling the contact via to make the plug. Tungsten, however, has relatively poor adhesion characteristics with respect to the surrounding insulation material. A lining between the tungsten plug and the surrounding insulating layer must be used to glue (adhere) the two materials together. The lining also serves as a barrier against diffusion of the filled tungsten into the insulating layer. Titanium, titanium nitride ($TiN_x$), or alloy titanium-tungsten (Ti:W), applied to the sidewall of the contact via by a PVD (physical vapor deposition) or CVD (chemical vapor deposition) procedure, is frequently used as such a lining to provide the necessary adhesion and the diffusion barrier.

A process for fabricating such a conventional contact plug is briefly examined below with reference to FIGS. 1A–1D of the accompanying drawings.

As is shown in FIG. 1A, a contact plug is constructed for an integrated circuit device that may include transistors comprising gate and source/drain regions fabricated over the surface of a silicon substrate 10. The surface of the substrate 10 is covered by an insulating layer 12 which may, for example, be a layer of BPSG (borophosphosilicate glass) or oxide. Designated locations over the surface of the insulating layer 12 are then patterned to form contact vias 13, which reveal regions 10a of the surface of the substrate 10 (only one such region being shown in the figure). This region 10a is the electrically conductive area where the contact plug is to be electrically connected. Formation of the contact via, in general, can be achieved by an anisotropic etching procedure.

Then, as is shown in FIG. 1B, a glue (adhesive) layer 14 can be formed over the side and bottom surfaces of the contact via 13. The surface of the insulating layer 12, proximate to the opening of the contact via may also be covered by this glue layer 14. The glue layer 14 may be applied by for example, a PVD procedure. The material used as the glue layer 14 may be, for example, titanium. Titanium nitride may be additionally used successively to form a composite glue layer comprising the titanium layer and a titanium nitride layer.

As shown in FIG. 1C, the internal space of the opening of the contact via 13 is then filled with an electrically conductive material 16. The conductive material 16 may exceed the internal space of the contact via 13 and cover the surface of the glue layer 14 proximate to the area of the contact via opening. The material 16 may, for example, be tungsten, copper, or aluminum. These electrically conductive materials can be applied to the contact via 13 utilizing a PVD or CVD procedure. Voids such as the void schematically represented by reference numeral 18, are inevitable in some of the contact vias, as a result of poor step coverage when the contact vias are filled with the plug material.

Finally, as is shown in FIG. 1D, a CMP (chemical mechanical polishing) procedure may then be employed to remove the portion of the electrically conductive layer 16 and the glue layer 14 above the surface of the device, until the insulating layer 12 is revealed. At this stage, formation of a conventional contact plug 18a is complete.

In the above-described prior art process for the fabrication of a contact plug, the formation of the glue layer 14 is necessary, especially inside the contact via 13. However, due to the fact that the compactness of the applied glue layer 14 is frequently insufficient, the speed of removal for the conductive material and the glue layer when the CMP procedure is applied is greatly variable. As a result, the polished surface is not sufficiently flat. Therefore, the contact plug does not have a sufficiently flat surface, so that recesses are present. Further, the presence of voids 18 inside the plugs not only increases the electrical resistance of the plugs, but also allows the penetration of slurry via the glue layer to severely affect the characteristics of the fabricated circuit components.

SUMMARY OF THE INVENTION

It is therefore an object of the invention to provide a process for fabricating semiconductor IC device contact plugs that are free of the formation of voids, in order to prevent deterioration of the characteristics of the plugs.

It is another object of the invention to provide a process for fabricating semiconductor IC device contact plugs that have a planar top surface in the fabricated substrate.

The invention achieves the above-identified objects by providing a process for fabricating contact plugs for semiconductor IC devices. The process comprises first forming an insulating layer over the surface of an IC substrate. The insulating layer is then patterned to form contact vias revealing the surface of the electrically conductive regions of the IC circuitry that require electrical connections by the contact plugs. A glue (adhesive) layer is then formed over sidewall surfaces inside the contact vias. The glue layer is then densified by either a rapid thermal annealing or a plasma processing procedure, for example. The internal space of each contact via is then filled with an electrically conductive material to form a contact plug. The surface of the substrate is then polished to remove the electrically conductive material and glue layer covering the surface of the insulating layer until the insulating layer surface is exposed, and the top surface of each formed contact plug is planarized flat with the surface of the insulating layer. The densification processing prevents the formation of voids when the plugs are formed, thereby improving the characteristics of the plugs.

BRIEF DESCRIPTION OF THE DRAWINGS

Other objects, features, and advantages of the invention will become apparent from the following detailed descrip

DETAILED DESCRIPTION OF THE PREFERRED EMBODIMENT

Figure 1A:
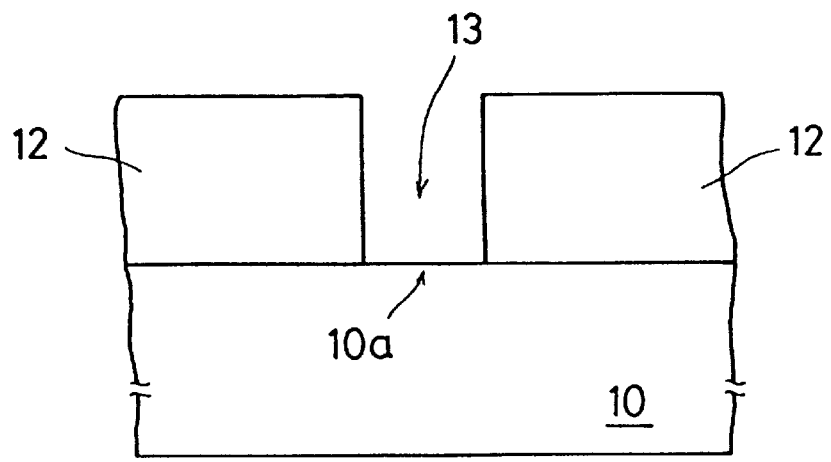
- FIGS. 1A–1D are cross-sectional views showing the fabrication of a conventional contact plug by a conventional process.
Figure 1B:
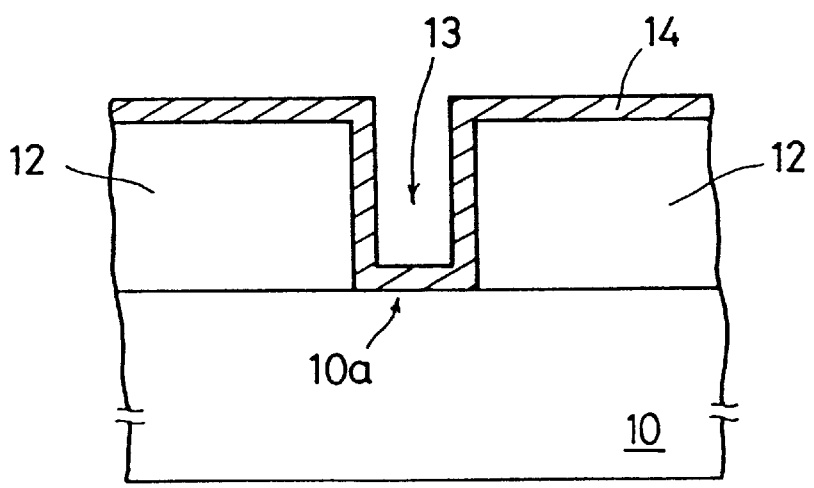
Figure 1C:
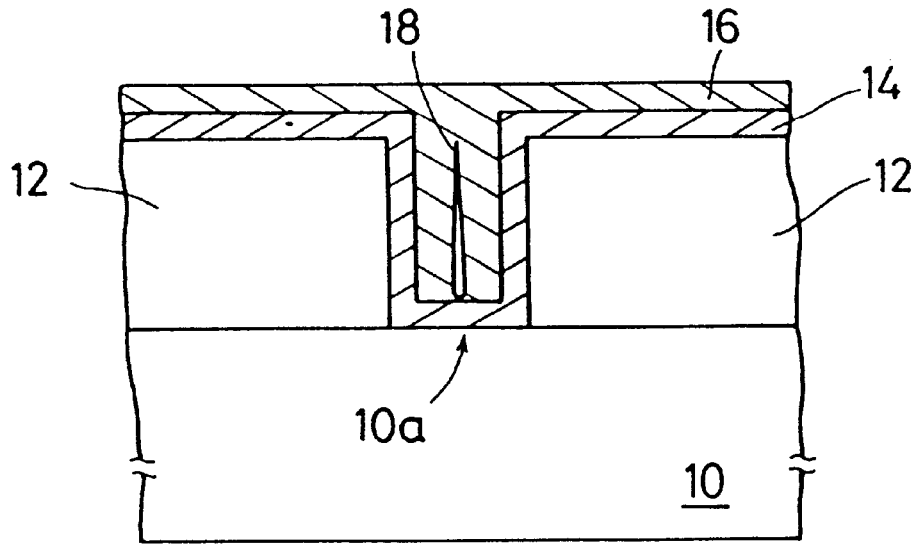
Figure 1D:
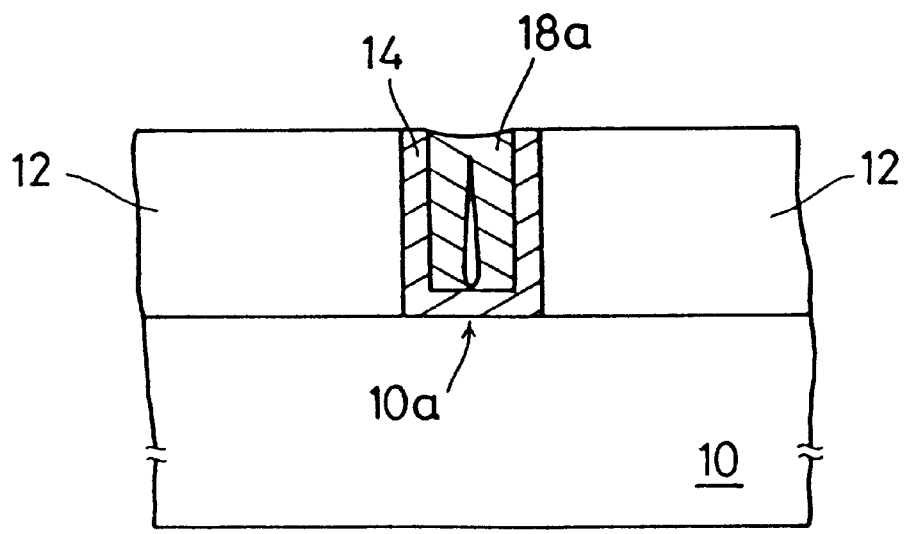
Figure 2A:
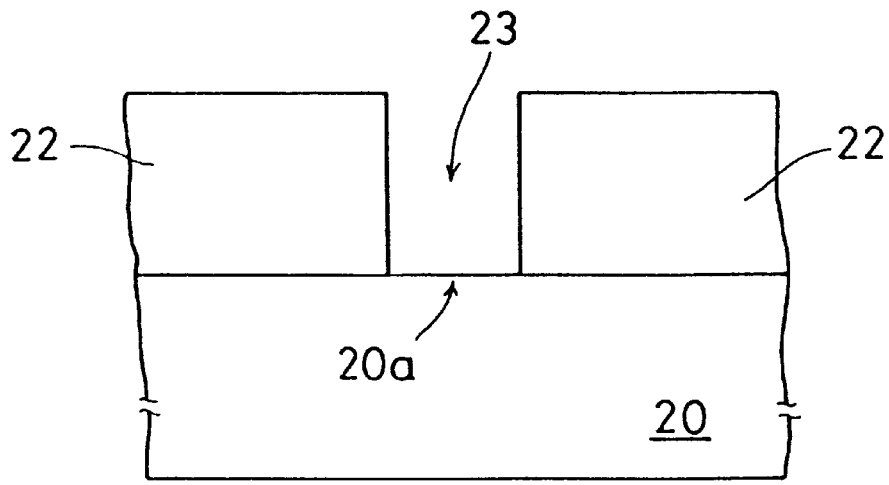
FIGS. 2A–2E are cross-sectional views showing the fabrication of a contact plug by a fabrication process in accordance with a preferred embodiment of the invention.

Contact plugs may be required, for example, in an integrated circuit device having transistors that include gate and source/drain regions fabricated over the surface of a silicon substrate. Referring first to FIG. 2A, the surface of a substrate 20 is covered by an insulating layer 22 which may, for example, be a layer of BPSG (borophosphosilicate glass) or any suitable oxide. Designated locations over the surface of the insulating layer 22 are then patterned to form contact vias such as the contact via 23, which reveals a region 20a of the surface of the silicon substrate 20. This region 20a is an electrically conductive area where a contact plug is to be electrically connected. Formation of the contact vias, in general, can be achieved by anisotropic etching in combination with a photolithographic procedure.

Figure 2B:
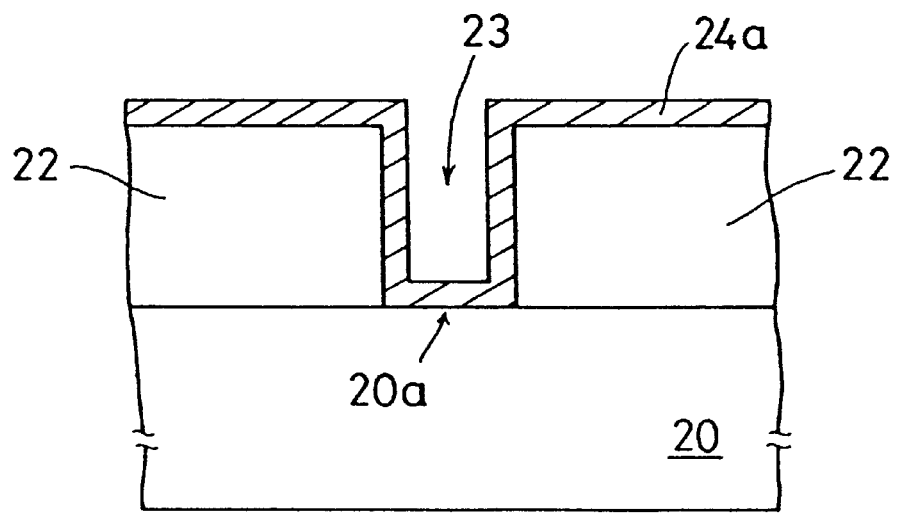

Then, as is shown in FIG. 2B, a glue (adhesive) layer 24a is formed over the sidewall surface and the bottom surface of the contact via 23. Over the surface of the insulating layer 22, the area proximate to and surrounding the opening of the contact via 23 may also be covered by the glue layer 24a. The glue layer 24a is applied by, for example, a PVD procedure. The material used for the glue layer 24a may, for example, be titanium. A layer of titanium nitride ($TiN_x$), alloy titanium-tungsten (Ti:W), or tungsten nitride ($WN_x$) may then be additionally applied in succession to form a composite glue (adhesive) layer.

Figure 2C:
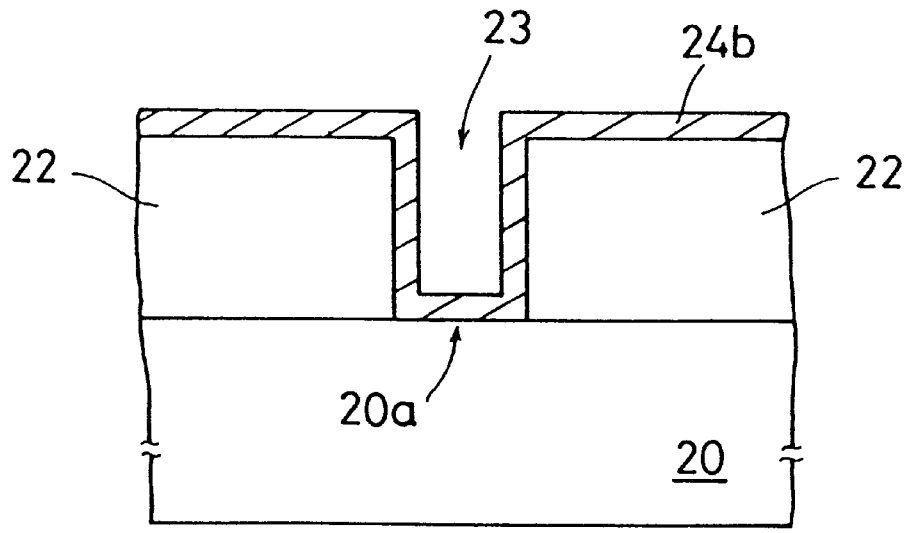

Then, the deposited glue layer 24a is subject to a densification procedure, for example, a rapid thermal annealing procedure which heats the device to a temperature of less than about 1,000° C. and continues the heating for a period of about five minutes. The result is a densified glue (adhesive) layer 24b, as shown in FIG. 2C, which has a more compact structural composition than the originally deposited layer 24a.

Figure 2D:
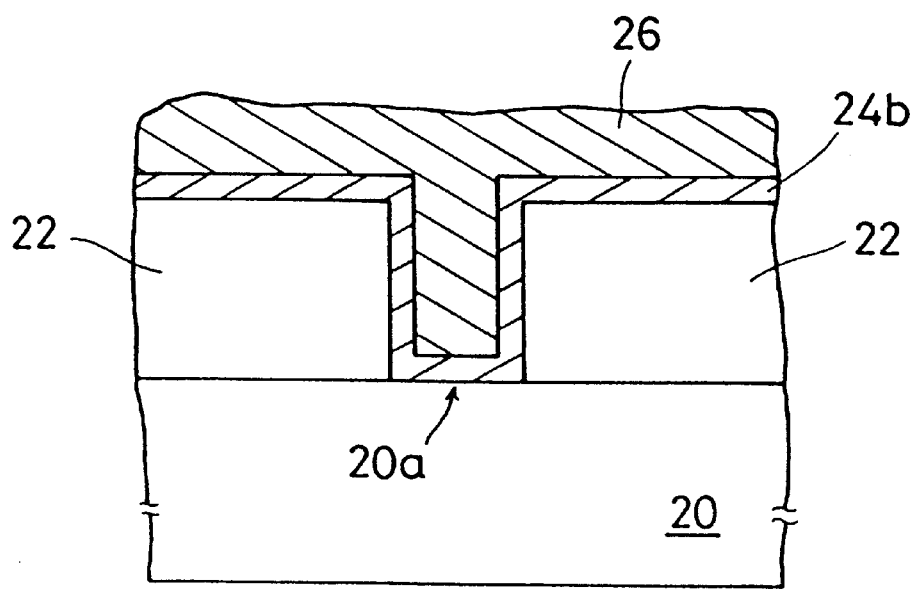

In subsequent stage shown in FIG. 2D, the internal space of the opening of the contact via 23 is then filled with a layer of electrically conductive material 26. The applied conductive material 26 may exceed the internal space inside the contact via 23, and cover the surface of the glue layer 24b proximate to the area of the contact via opening. The material 26 used to fill the contact via 23 may be, for example, tungsten, copper, or aluminum. These electrically conductive materials can be provided in the contact via 23 utilizing a PVD or CVD procedure.

Figure 2E:
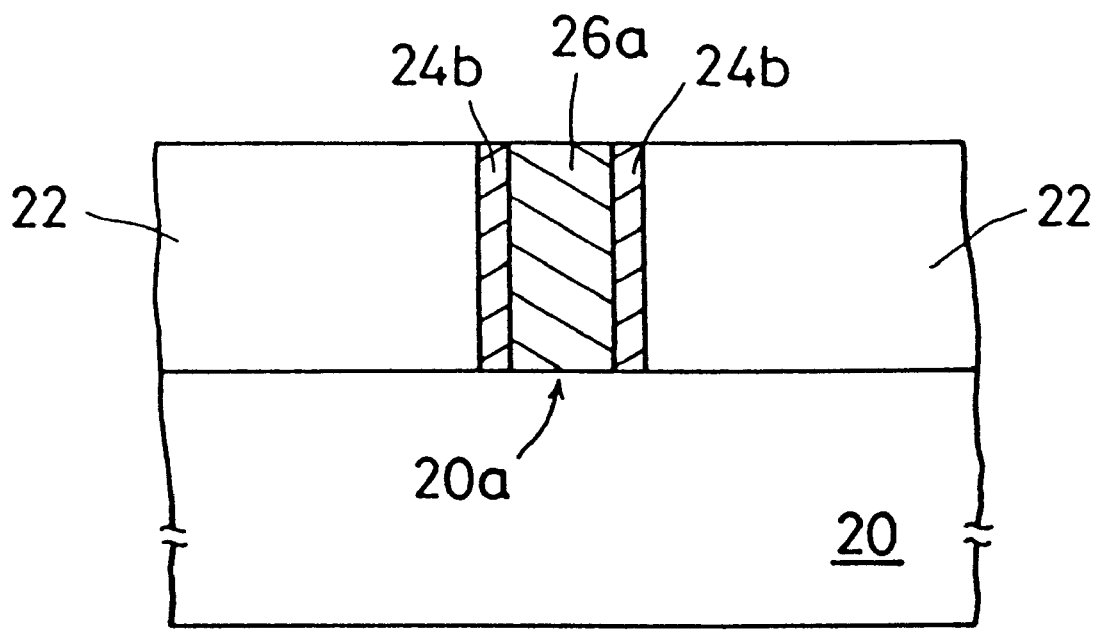

Finally, as is shown in FIG. 2E, procedures such as CMP (chemical mechanical polishing) may then be employed to remove the portions of the electrically conductive layer 26 and the glue layer 24b above the surface of the device until the insulating layer 22 is revealed and the surface of electrically conductive material of the layer 26 in the via has the same level as the surfaces of the insulating layer 22. At this stage, construction of the contact plug 26b is complete.

In another embodiment of the invention, the step of substantially densifying the glue layer may be different from that according to the first embodiment described above. For example, a plasma processing procedure in which nitrogen, hydrogen, argon, or a mixture of any selected combination of these gases is heated to a temperature of about less than 1,000° C., and the structure of FIG. 2B is maintained in this environment for about five minutes, may be used to achieve the purpose of glue layer densification.

By practically densifying the glue layer that interfaces between the contact plug material and the surrounding insulating layer, the formation of a plug cylinder body, free of disadvantageous voids, can be assured. Slurry penetration via the glue layer, as would disadvantageously affect the characteristics of the formed plug, can be avoided as a result of the absence of the undesirable voids in the plugs. Moreover, the densified glue layer also allows for an even rate of material removal when the surface of the device is polished. This allows for the formation of a planarized device surface in the region of the contact plug.

Thus, while the invention has been described by way of examples and in terms of preferred embodiments, it is to be understood that the invention is not limited thereto. To the contrary, it is intended to cover various modifications as well as similar arrangements and procedures. The scope of the appended claims should be accorded the broadest possible interpretation so as to encompass all such modifications and similar arrangements and procedures.

What is claimed is:

1. A method for fabricating a contact plug in a semiconductor integrated circuit device, comprising:

forming a device, including an electrically conductive region, on a semiconductor substrate;

forming an insulating layer over a surface of the semiconductor substrate;

forming a contact via in the insulating layer to reveal a surface of the electrically conductive region;

forming an adhesive layer on an interior surface of the contact via and extending over an upper surface of the insulating layer;

after said forming an adhesive layer, densifying the adhesive layer at a temperature of about 1000° C., and sustaining said densifying at about 1000° C. for about 5 minutes;

filling the contact via with an electrically conductive material to form a contact plug, the conductive material covering the surface of the insulating layer proximate to the contact; and removing portions of the electrically conductive material and adhesive layer that cover the surface of the insulating layer, until the upper surface of the insulating layer is exposed and an upper surface of the electrically conductive material is planarized with the upper surface of the insulating layer.

2. The method of claim 1, wherein the adhesive layer is a composite layer comprising a titanium and a titanium nitride.

3. The method of claim 1, wherein the adhesive layer is an titanium-tungsten alloy layer.

4. The method of claim 1, wherein the adhesive layer is a tungsten nitride layer.

5. The method of claim 1, wherein the electrically conductive material forming the contact plugs is a material comprising tungsten.

6. The method of claim 1, wherein the electrically conductive material forming the contact plug is a material comprising aluminum.

7. The method of claim 1, wherein the electrically conductive material forming the contact plug is a material comprising copper.

8. The method of claim 1, wherein said step of removing includes a chemical mechanical polishing.

9. The method of claim 1, wherein said step of densifying includes rapid thermal annealing.

10. The method of claim 1, wherein densifying the adhesive layer includes a plasma treatment.

11. The method of claim 10, wherein the plasma treatment is performed at a temperature of about less than 1,000° C. and sustained for less than about 5 minutes.

12. The method of claim 10, wherein the plasma treatment is performed in a gas ambient containing argon.

13. The method of claim 10, wherein the plasma treatment is performed in a gas ambient containing hydrogen.

14. The process of claim 10, wherein the plasma treatment is performed in a gas ambient containing nitrogen.

15. A method for fabricating a contact plug in a semiconductor integrated circuit device, comprising:

forming a device having an electrically conductive region, on a semiconductor substrate;

forming an insulating layer over a surface of the semiconductor substrate;

forming a contact via in the insulating layer to reveal a surface of the electrically conductive region;

forming an adhesive layer of titanium nitride, on an interior surface of the contact via, the adhesive layer extending out of the contact via and covering a surface of the insulating layer proximate to the contact layer;

after said forming an adhesive layer, densifying the adhesive layer at a temperature of about 1000° C. and sustaining said densifying at about 1000° C., for about 5 minutes;

filling the contact via with an electrically conductive material to form a contact plug in the contact via; and removing portions of the electrically conductive material and adhesive layer that cover the upper surface of the insulating layer, until the upper surface of the insulating material is exposed and the upper surface of the electrically conductive material is planarized with the upper surface of the insulating layer.

16. The method of claim 15, wherein the densifying includes rapid thermal annealing.

17. The method of claim 16, wherein the rapid thermal annealing is performed at a temperature that is less than about 1,000° C. and is sustained for about 5 minutes.

18. The method of claim 15, wherein the densifying includes a plasma treatment.

19. The method of claim 18, wherein the plasma treatment is performed at a temperature that is less than about 1,000° C. and is sustained for about 5 minutes.

20. A method for fabricating a contact plug in a semiconductor integrated circuit device, comprising:

forming a device, including an electrically conductive region, on a semiconductor substrate;

forming an insulating layer over a surface of the semiconductor substrate;

forming a contact via in the insulating layer to reveal a surface of the electrically conductive region;

forming an adhesive layer of tungsten nitride on an interior surface of the contact via, the adhesive layer extending out of the contact via and covering a surface of the insulating layer proximate to the contact layer;

after forming the adhesive layer, densifying the adhesive layer of titanium nitride, wherein said densifying is performed at a temperature of about less than 1000° C. and is sustained for about less than 5 minutes;

filling the contact via with an electrically conductive material to form a contact plug in the contact via; and removing portions of the electrically conductive material and adhesive layer that cover the surface of the insulating layer, until the surface of the insulating layer is exposed and the surface of the electrically conductive material has the same altitude as the surface of the insulating layer.

\* \* \* \* \*